US010763135B2

(12) United States Patent
Saketi et al.

(10) Patent No.: US 10,763,135 B2
(45) Date of Patent: Sep. 1, 2020

(54) INTEGRATED ELASTOMERIC INTERFACE LAYER FORMATION AND SINGULATION FOR LIGHT EMITTING DIODES

(71) Applicant: Facebook Technologies, LLC, Menlo Park, CA (US)

(72) Inventors: Pooya Saketi, Cork (IE); Karsten Moh, Saarbrucken (DE); Tilman Zehender, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/884,243

(22) Filed: Jan. 30, 2018

(65) Prior Publication Data
US 2019/0237347 A1 Aug. 1, 2019

(51) Int. Cl.
*H01L 33/44* (2010.01)
*H01L 21/67* (2006.01)
*H01L 33/06* (2010.01)
*H01L 33/24* (2010.01)
*H01L 33/40* (2010.01)
(Continued)

(52) U.S. Cl.
CPC ...... *H01L 21/67144* (2013.01); *H01J 37/321* (2013.01); *H01L 21/6836* (2013.01); *H01L 21/784* (2013.01); *H01L 25/0753* (2013.01); *H01L 27/156* (2013.01); *H01L 33/0095* (2013.01); *H01L 33/06* (2013.01); *H01L 33/10* (2013.01); *H01L 33/24* (2013.01); *H01L 33/405* (2013.01); *H01L 33/44* (2013.01); *B65G 47/90* (2013.01); *H01J 2237/334* (2013.01); *H01L 2933/0025* (2013.01); *H01S 5/183* (2013.01)

(58) Field of Classification Search
CPC .......... H01L 21/6836; H01L 21/68707; H01L 21/784; H01L 25/0753; H01L 27/156; H01L 33/0079; H01L 33/0095; H01L 33/44; H01L 33/56; H01L 2933/0025; H01S 5/183
See application file for complete search history.

(56) References Cited

U.S. PATENT DOCUMENTS

2012/0028438 A1 2/2012 Richter
2012/0153476 A1\* 6/2012 Shen .................. H01L 21/3081
257/750
(Continued)

FOREIGN PATENT DOCUMENTS

WO WO-2017037475 A1 \* 3/2017 .......... H01L 27/156
WO WO-2017/164484 A1 9/2017

OTHER PUBLICATIONS

PCT International Search Report and Written Opinion, PCT Application No. PCT/US2019/015870, dated May 17, 2019, 16 pages.

*Primary Examiner* — Stephen W Smoot
(74) *Attorney, Agent, or Firm* — Fenwick & West LLP

(57) ABSTRACT

Embodiments relate to an integrated process for forming an elastomeric layer over an epitaxial structure of multiple light emitting diode (LED) dies, and then etching the elastomeric layer into individual elastomeric interface layers (elayers) on each of the LED dies and etching the epitaxial structure to singulate the LED dies. The elayer allows each LED die to be picked up by a pick-up head (or pick and place head (PPH)), and placed onto a display substrate including control circuits for sub-pixels of an electronic display. In some embodiments, the LED dies are micro-LED (uLED) dies.

20 Claims, 11 Drawing Sheets

(51) Int. Cl.
  *H01L 33/00*      (2010.01)
  *H01L 25/075*     (2006.01)
  *H01J 37/32*      (2006.01)
  *H01L 33/10*      (2010.01)
  *H01L 21/784*     (2006.01)
  *H01L 27/15*      (2006.01)
  *H01L 21/683*     (2006.01)
  B65G 47/90        (2006.01)
  H01S 5/183        (2006.01)

(56) References Cited

U.S. PATENT DOCUMENTS

| | | |
|---|---|---|
| 2013/0026511 A1 | 1/2013 | Yeh et al. |
| 2014/0080287 A1* | 3/2014 | Zull .................. H01L 31/18 438/463 |
| 2014/0084240 A1* | 3/2014 | Hu .................. H01L 25/0753 257/13 |
| 2015/0132873 A1* | 5/2015 | Rogers .................. H01L 33/54 438/27 |
| 2015/0325742 A1 | 11/2015 | Liu et al. |
| 2017/0141155 A1 | 5/2017 | Hughes et al. |
| 2018/0158704 A1* | 6/2018 | Saketi .............. H01L 21/67144 |
| 2019/0139794 A1* | 5/2019 | Saketi .............. H01L 21/67144 |
| 2019/0181023 A1* | 6/2019 | Saketi .............. H01L 21/67144 |

* cited by examiner

200

Form an elastomeric layer on a surface of an epitaxial structure to define first portions and second portions of the elastomeric layer and epitaxial structure, the first portions of the epitaxial structure defining an array of light emitting diode (LED) dies
202

Form a metallic layer on the elastomeric layer
204

Form a photoresist mask on first portions of the metallic layer covering the first portions of the elastomeric layer and epitaxial structure
206

Etch second portions of the metallic layer using the photoresist mask to form a metallic mask from first portions of the metallic layer over the first portions of the elastomeric layer and epitaxial structure
208

Etch second portions of the elastomeric layer and epitaxial structure using the metallic mask
210

Remove the photoresist mask and metallic mask to form singulated LED dies from the first portions of the epitaxial structure, each of the LED dies including an elastomeric interface layer
212

INTEGRATED ELASTOMERIC INTERFACE LAYER FORMATION AND SINGULATION FOR LIGHT EMITTING DIODES

BACKGROUND

The present disclosure relates to semiconductor device fabrication, specifically to forming a conformable material over light emitting diodes (LEDs) to facilitate adhesive attachment in display fabrication.

In LED display fabrication, the LEDs may be moved from one substrate to another. For example, LEDs may be placed onto a carrier substrate, and then picked and placed from the carrier substrate onto a display substrate including control circuits for controlling the LEDs. Transferring the LEDs from the carrier substrate onto the display substrate may involve attaching the LEDs with a pick-up head. As the form factor of the LED's decreases, the picking and placing of LEDs into desired arrangements and without damaging the LED dies becomes increasingly difficult.

SUMMARY

Embodiments relate to forming an elastomeric layer over an epitaxial structure of multiple light emitting diode (LED) dies, and then etching the elastomeric layer into individual elastomeric interface layers (elayers) on each of the LED dies and etching the epitaxial structure to singulate the LED dies. The elayers facilitate adhesion of the LED dies with a pick-up head for pick and place operations during the manufacturing of an electronic display.

In some embodiments, one or more layers are formed on a first surface of an epitaxial structure. First portions of the epitaxial structure define an array of light emitting diode (LED) dies. At least a subset of the first portions are between second portions of the epitaxial structure. A second surface of the epitaxial structure faces a carrier substrate. The one or more layers and the epitaxial structure are singulated into individual LED dies by selectively etching the second portions of the epitaxial structure and portions of the one or more layers over the second portions of the epitaxial structure.

In some embodiments, forming the one or more layers on the first surface of the epitaxial structure further comprise forming an elastomeric layer over the first surface of the epitaxial structure, forming a metallic layer over the elastomeric layer, and forming a photoresist mask over the metallic layer.

In some embodiments, portions of the metallic layer over the second portions of the epitaxial structure are etched to form a patterned metallic mask. The second portions of the epitaxial structure and portions of the elastomeric layer over the second portions of the epitaxial structure are etched.

In some embodiments, the photoresist mask and the metallic mask are removed to form singulated LED dies, each of the singulated LED dies including an elastomeric interface layer formed from portions of the elastomeric layer over the first portions of the epitaxial structure.

In some embodiments, the etching of the portions of the elastomeric layer and the second portions of epitaxial structure is performed by anisotropic dry etching. In some embodiments, the anisotropic dry etching includes inductively coupled plasma (ICP) etching.

In some embodiments, at least a portion of the LED dies on the carrier substrate are picked up by attaching a non-conformable pick-up head to the elastomeric interface layers over the LED dies. At least a portion of the LED dies attached to the non-conformable pick-up head are placed on a display substrate defining pixel control circuits of an electronic display.

In some embodiments, the LED dies are micro-LEDs or vertical-cavity surface-emitting lasers (VCSELs).

In some embodiments, the metallic layer is formed by electron beam deposition.

In some embodiments, the etching of the second portions of the metallic layer is performed by wet etching.

In some embodiments, an LED die is manufactured by a process. One or more layers on a first surface of an epitaxial structure are formed. A first portion of the epitaxial structure defines a light emitting diode (LED) die. At least a portion of the first portion is between second portions of the epitaxial structure. A second surface of the epitaxial structure faces a carrier substrate. The one or more layers and the epitaxial structure are singulated into an individual LED die by selectively etching the second portions of the epitaxial structure and portions of the one or more layers over the second portions of the epitaxial structure.

In some embodiments, forming the one or more layers on the first surface of the epitaxial structure further comprise forming an elastomeric layer over the first surface of the epitaxial structure, forming a metallic layer over the elastomeric layer, and forming a photoresist mask over the metallic layer.

In some embodiments, portions of the metallic layer over the second portions of the epitaxial structure are etched to form a patterned metallic mask. The second portions of the epitaxial structure and portions of the elastomeric layer over the second portions of the epitaxial structure are etched.

In some embodiments, the photomask and the metallic mask are removed to form a singulated LED die. The singulated LED die includes an elastomeric interface layer formed from a portion of the elastomeric layer over the first portion of the epitaxial structure.

In some embodiments, the LED die on the carrier substrate is picked up by attaching a non-conformable pick-up head to the elastomeric interface layer over the LED die. The LED die attached to the non-conformable pick-up head is placed on a display substrate defining a pixel control circuit of an electronic display.

BRIEF DESCRIPTION OF DRAWINGS

FIG. 2 is a flowchart of a method for forming an elayer over LED dies on the carrier substrate, according to one embodiment.

The figures depict various embodiments of the present disclosure for purposes of illustration only. One skilled in the art will readily recognize from the following discussion that alternative embodiments of the structures and methods illustrated herein may be employed without departing from the principles of the disclosure described herein.

DETAILED DESCRIPTION

Embodiments are described herein with reference to the figures where like reference numbers indicate identical or functionally similar elements. Also in the figures, the left most digits of each reference number corresponds to the figure in which the reference number is first used.

Embodiments relate to an integrated process for forming an elastomeric layer over an epitaxial structure of multiple light emitting diode (LED) dies, and then etching the elastomeric layer into individual elastomeric interface layers (elayers) on each of the LED dies and etching the epitaxial structure to singulate the LED dies. Specifically, after the elastomeric layer is formed over the epitaxial structure, a metallic layer and a photoresist mask are formed over the elastomeric layer. Using the photoresist mask portions of the metallic layer are selectively etched to form a patterned metallic mask. Using the newly formed metallic mask, portions of the elastomeric layer and epitaxial structure are selectively etched to singulate the epitaxial structure into individual LED dies. The photoresist mask and metallic mask are removed to form an elastomeric interface layer (elayer) over each of the singulated LED dies.

The deposited elayer on each LED die provides an adhesive material for attachment with a pick-up head (or pick and place head (PPH)) for pick up and placement of the LED die onto a display substrate including control circuits for sub-pixels of an electronic display. In some embodiments, the LED dies are micro-LED dies (referred to herein as "uLED" dies) or other micro-electric devices, such as vertical-cavity surface-emitting lasers (VCSELs).

Figure 1:
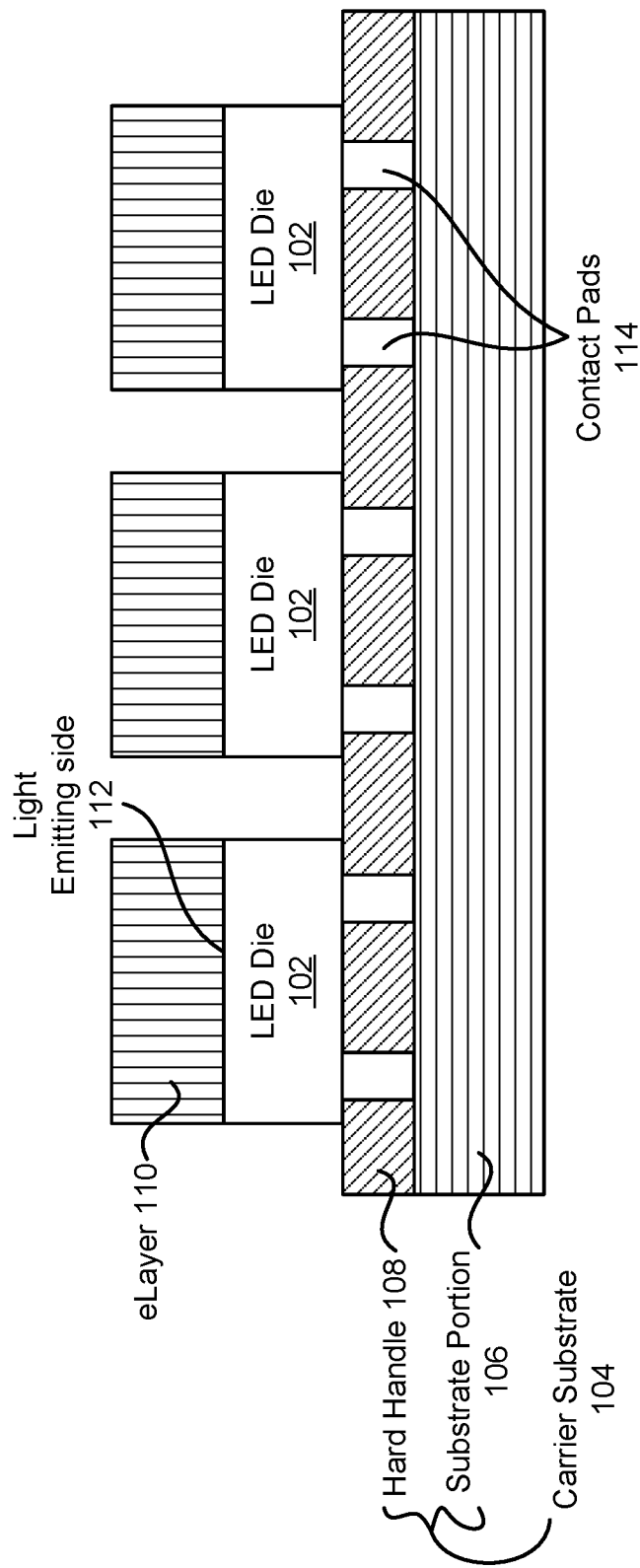
FIG. 1 is a cross sectional view of LED dies on a carrier substrate with an elastomeric interface layer (elayer) over each LED die, according to one embodiment.

FIG. 1 is a cross sectional view of LED dies 102 on a carrier substrate 104 with an elastomeric interface layer (elayer) 110 over each LED die 102, according to one embodiment. In some embodiments, the LED dies 102 include an epitaxial structure that is grown on a growth substrate. After fabrication of the epitaxial structure of the LED dies 102 and prior to singulation of the LED dies 102 into individual dies, the LED dies 102 are placed onto the carrier substrate for formation of the elayer 110 and for singulation into individual LED dies 102. After formation of the elayers 110 and the singulation, the LED dies 102 may be selectively picked up from the carrier substrate 104 via adhesive attachment with the elayers 110, and placed onto a display substrate of an electronic display. The carrier substrate 104 may include a substrate portion 106 on which the LED dies 102 are placed, and a hard handle 108 between the LED dies 102 and the substrate portion 106 that holds the LED dies 102 on the substrate portion 106.

The elayer 110 is formed on the light emitting side 112 of each LED die 102. The elayer 110 is a conformable layer that allows each of the LED dies 102 to be attached to and picked up by a pick and place head (PPH) (e.g., as discussed in greater detail with reference to FIG. 9). In particular, the elayer 110 facilitates attachment with non-conformable pick-up surfaces of the PPH, or in another example, conformable pick-up surfaces of a PPH. The elayer 110 may attach to a pick-up surface due to adhesion forces, such as Van der Waals forces. The elayer 110 may include any material that provides sufficient adhesion to pick-up surfaces. For example, the elayer 110 includes elastomers, such as Polydimethylsiloxane (PDMS) or Polyurethane (PU). In some embodiments, the interface layer on the light emitting side 112 of the LED dies 102 contains no elastomeric materials. For example, the elayer 110 includes gels that provide adhesion via covalent chemical bonds. The elayer 110 may be polymer with viscoelasticity (having both viscosity and elasticity). The elayer 110 may also have weak inter-molecular forces, a low Young's modulus, and/or high failure strain compared with other materials.

Figure 10:
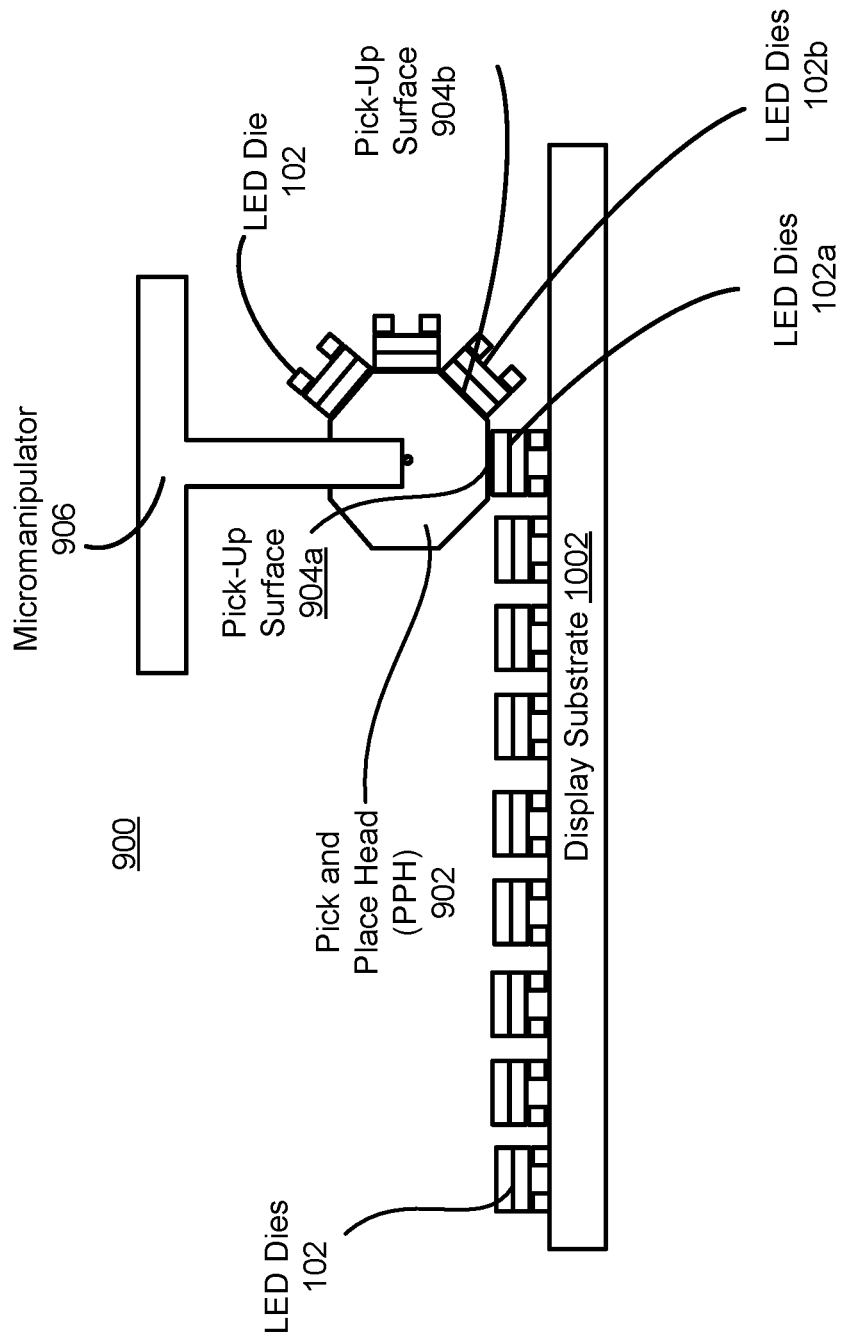
FIG. 10 is a display manufacturing system during placement of LED dies on a display substrate, according to one embodiment.

Opposite the light emitting side 112 of each LED die 102 is a second side of the LED die 102 that faces the carrier substrate 104 and includes contact pads 114. The contact pads 114 may extend into the hard handle 108. Each of the LED dies 102 emit light from the light emitting side 112 when a potential voltage is applied across the contact pads 114. When the LED dies 102 are picked up from the carrier substrate 104 and placed on a display substrate (e.g., as shown in FIG. 10), the contact pads 114 may connect with control circuits in the display substrate that drive the LED dies 102.

As discussed in greater detail below in connection with FIG. 11, the LED dies 102 may be uLED dies. The LED dies 102 include an epitaxial structure with gallium-based materials, such as gallium nitride (GaN), gallium arsenide (GaAs), or gallium phosphide (GaP). The structure and materials of the epitaxial structure may vary, such as depending on the color of emitted light.

The carrier substrate 104 has a flat surface mounted with LED dies 102 that supports the LED dies 102 during the process of forming the elayer 110 over each LED die 102, and singulating the LED dies 102 which are manufactured using a shared epitaxial structure. The carrier substrate 104 may have any number of LED dies 102 attached, such as one or more arrays of LED dies. The carrier substrate 104 may have a hard flat surface, rigid enough to support the LED dies 102 as the carrier substrate 104 is moved. The hard handle 108 may be a polymer that attaches the LED dies 102 to the substrate portion 106. In some embodiments, the LED dies 102 are released from the carrier substrate 104 by removing or weakening the hard handle 108 or selected portions of the hard handle 108 (e.g., with a solvent, laser treatment, or dry etching). In other embodiments, the hard handle 108 applies a weak adhesive force such that the LED dies 102 may be removed with a force (e.g., by a PPH adhering to the LED dies 102 and lifting the LED dies away from the carrier substrate 104) without damaging the LED dies 102.

FIG. 2 is a flowchart of a method 200 for forming an elayer 110 over LED dies 102 on the carrier substrate 104, according to one embodiment. Specifically, select portions are removed from an epitaxial structure and an elastomeric layer, metallic layer, and photoresist deposited on the epitaxial structure, to form an elayer 110 over individual LED dies 102. Among other advantages, the method 200 combines separate methods for LED die singulation and elayer formation into a single process, saving time and reducing complexity. Furthermore, the use of a single epitaxial structure, instead of singulated LED dies 102, reduces alignment errors when forming the elastomeric layer 402. In some embodiments, the method 200 and principles as described with reference to LEDs can be applied to other microelectric devices. For example, an elayer may be formed on a VCSEL to facilitate pick and place of the VCSEL. The steps may be performed in different orders, and the method 200 may include different, additional, or fewer steps. The method 200 is discussed with reference to FIGS. 3 through 8.

An elastomeric layer is formed 202 on a surface of an epitaxial structure to define first portions and second portions of the elastomeric layer. The epitaxial structure includes first portions defining LED dies, and second portions defining regions between the LED dies that are removed to singulate the LED dies. The first portions of the elastomeric layer define regions of the elastomeric layer over the first portions of the epitaxial structure, and the second portions of the elastomeric layer define regions of the elastomeric layer over the second portions of the epitaxial structure.

Figure 3:
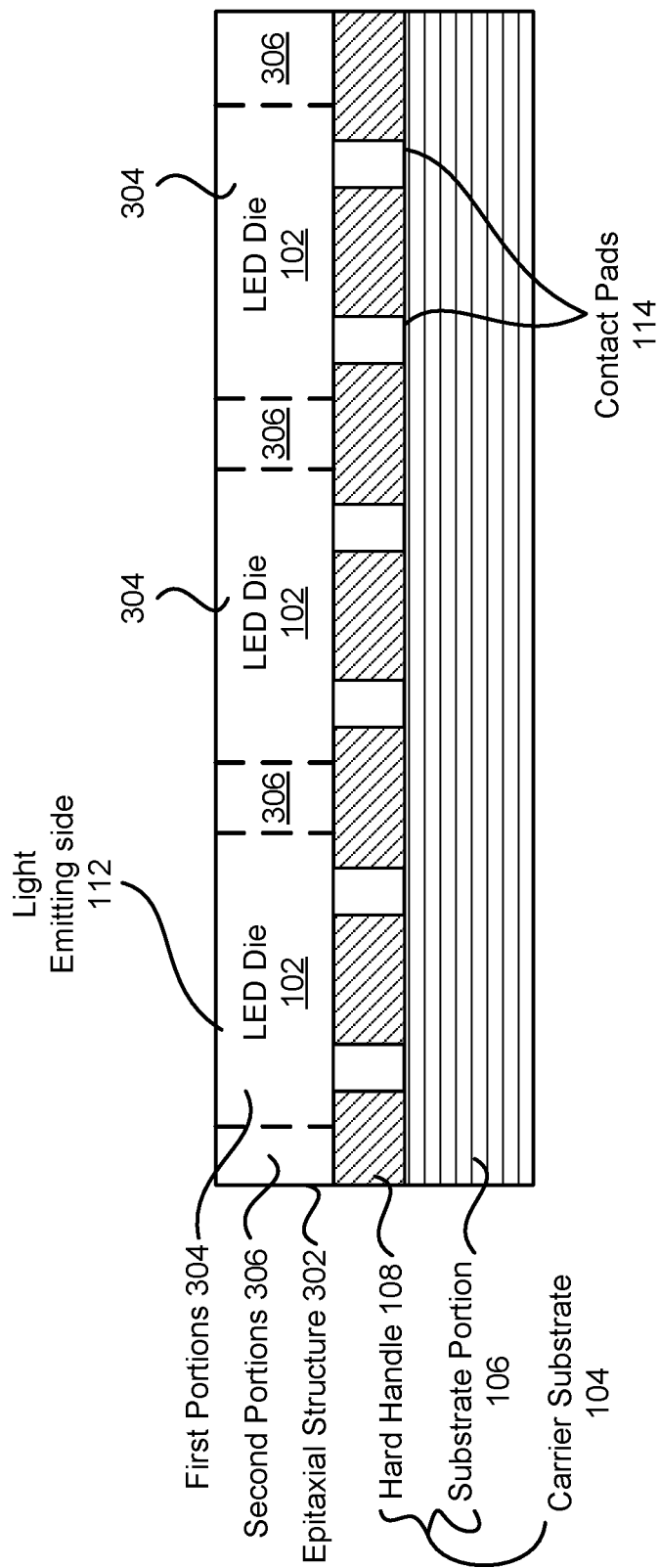
FIG. 3 is a cross sectional view of LED dies including an epitaxial structure of the LED dies on the carrier substrate, according to one embodiment.

FIG. 3 is a cross sectional view of LED dies 102 including the epitaxial structure 302 on the carrier substrate 104, according to one embodiment. As discussed above, the epitaxial structure 302 includes first portions 304 and second portions 306. The first portions 304 define the individual LED dies 102 and the second portions 306 are regions of the epitaxial structure 302 between the LED dies 102 that can be removed to singulate the LED dies 102. The epitaxial structure 302 may be grown on a growth substrate, and then the epitaxial structure 302 is processed to form the LED dies 102 including the contact pads 114 and the light emitting sides 112. The epitaxial structure 302 may then be flipped onto the carrier substrate 104 as shown in FIG. 3. Prior to singulation of the LED dies 102, the growth substrate is removed to expose the light emitting sides 112 of epitaxial structure 302, and the epitaxial structure 302 is attached to the carrier substrate 104 via the hard handle 108. Among other things, the growth substrate may be easier to remove from a unitary epitaxial structure 302 than from individual singulated LED dies 102.

Figure 4:
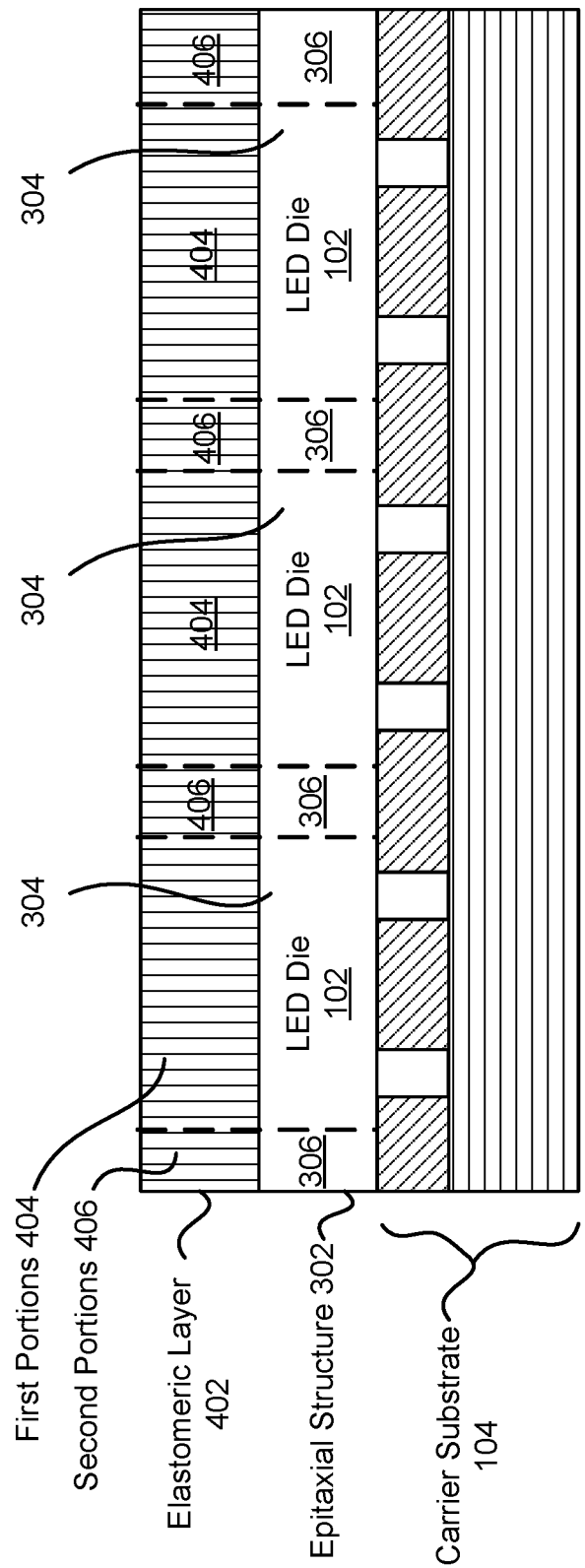
FIG. 4 is a cross sectional view of the LED dies including an elastomeric layer on the epitaxial structure of the LED dies, according to one embodiment.

FIG. 4 is a cross sectional view of the LED dies 102 including an elastomeric layer 402 on the epitaxial structure 302 of the LED dies 102, according to one embodiment. Prior to singulation of the LED dies 102, the elastomeric layer 402 has been formed on the light emitting side 112 of the epitaxial structure 302. The elastomeric layer 402 includes first portions 404 defined over the first portions 304 of the epitaxial structure 302 and second portions 406 defined over the second portions 306 of the epitaxial structure 302.

The elastomeric layer 402 forms a conformable layer over the epitaxial structure 302. As discussed in greater detail below, the first portions 404 of the elastomeric layer 402 form the elayers 110 over each of the LED dies 102, once the second portions 406 of the elastomeric layer 402 are removed. In some embodiments, the elastomeric material 402 is mixed with a solvent, and formed on the epitaxial structure 302 by spin coating. The elastomeric material 402 may then be soft baked or cured to minimize the solvent concentration. The curing or soft baking may harden the elastomeric layer 402 and may attach the elastomeric layer 402 on the epitaxial structure 302. The elastomeric layer 402 may be cured or baked in various ways, such as by application of light, heat, chemical additives, and/or vulcanization. In some embodiments, the elastomeric layer 402 includes any material that provides sufficient adhesion to pick-up surfaces.

After forming the elastomeric layer 402, a metallic layer is formed 204 on the elastomeric layer 402. The metallic layer can be formed on the elastomeric layer 402 by deposition techniques, such as sputtering or physical vapor deposition (PVD). For example, the metallic layer 502 is deposited by electron-beam deposition. In some embodiments, the metallic layer includes metal, such as Aluminum (Al) or Chromium (Cr). The metallic layer includes first portions and second portions defined over the first portions 404 and second portions 406 of the elastomeric layer 402. As discussed in greater detail below, the second portions of the metallic layer will be removed to form a metallic mask that is used for etching the second portions 406 of the elastomeric layer 402 and the second portions 306 of the epitaxial structure 302.

After forming the metallic layer, a photoresist mask is formed 206 on the first portions of the metallic layer over the first portions 404 of the elastomeric layer 402 and the first portions 304 of the epitaxial structure 302. To form the photoresist mask, a photoresist is formed on the metallic layer 502, and then the photoresist mask is formed from the photoresist. The metallic layer, photoresist, and photoresist mask are further described below, with reference to FIG. 5 and FIG. 6.

Figure 5:
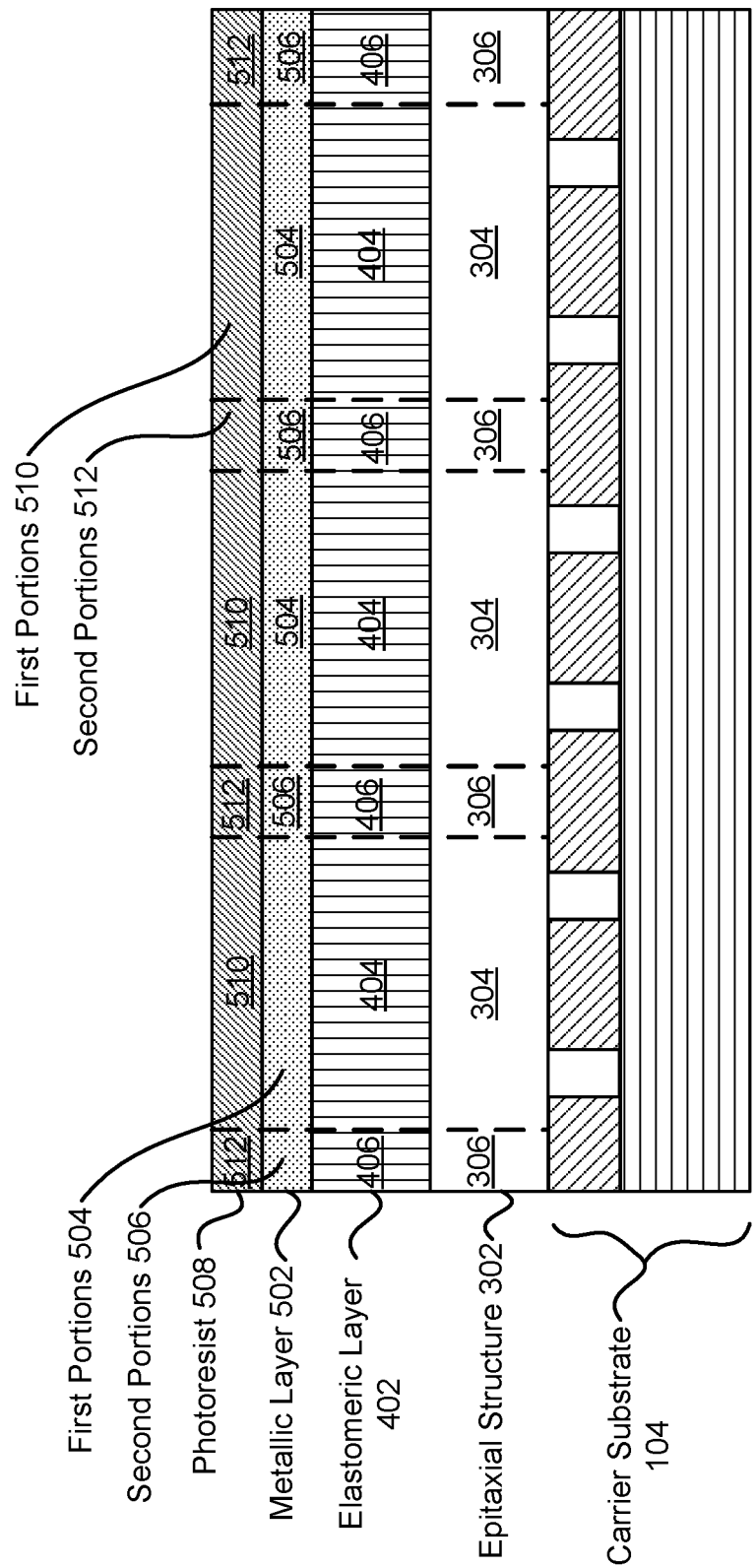
FIG. 5 is a cross sectional view of the LED dies including a photoresist and a metallic layer on the elastomeric layer, according to one embodiment.

FIG. 5 is a cross sectional view of the LED dies 102 including a photoresist 508 and a metallic layer 502 on the elastomeric layer 402, according to one embodiment. The metallic layer 502 has first portions 504 and second portions 506, and the photoresist 508 has first portions 510 and second portions 512. The respective portions of the metallic layer 502 and photoresist 508 are defined by the first and second portions of the elastomeric layer 402 and epitaxial structure 302.

The photoresist 508 is a light-sensitive material that becomes soluble or insoluble when exposed to light at specific wavelengths, such as collimated ultraviolet (UV) light. For example, portions of a positive photoresist material exposed to light become soluble. In another example, portions of a negative photoresist material exposed to light become insoluble, leaving the unexposed portions soluble. The soluble portions of a photoresist material can be removed by a solvent, such as a photoresist developer. The photoresist 508 can also resist certain etching processes. As a result, by selectively applying light and removing soluble portions of the photoresist 508, the photoresist 508 can become an etching mask that protects portions of the underlying material from etching processes. In some embodiments, the photoresist 508 is formed on the metallic layer 502 by spin coating.

Figure 6:
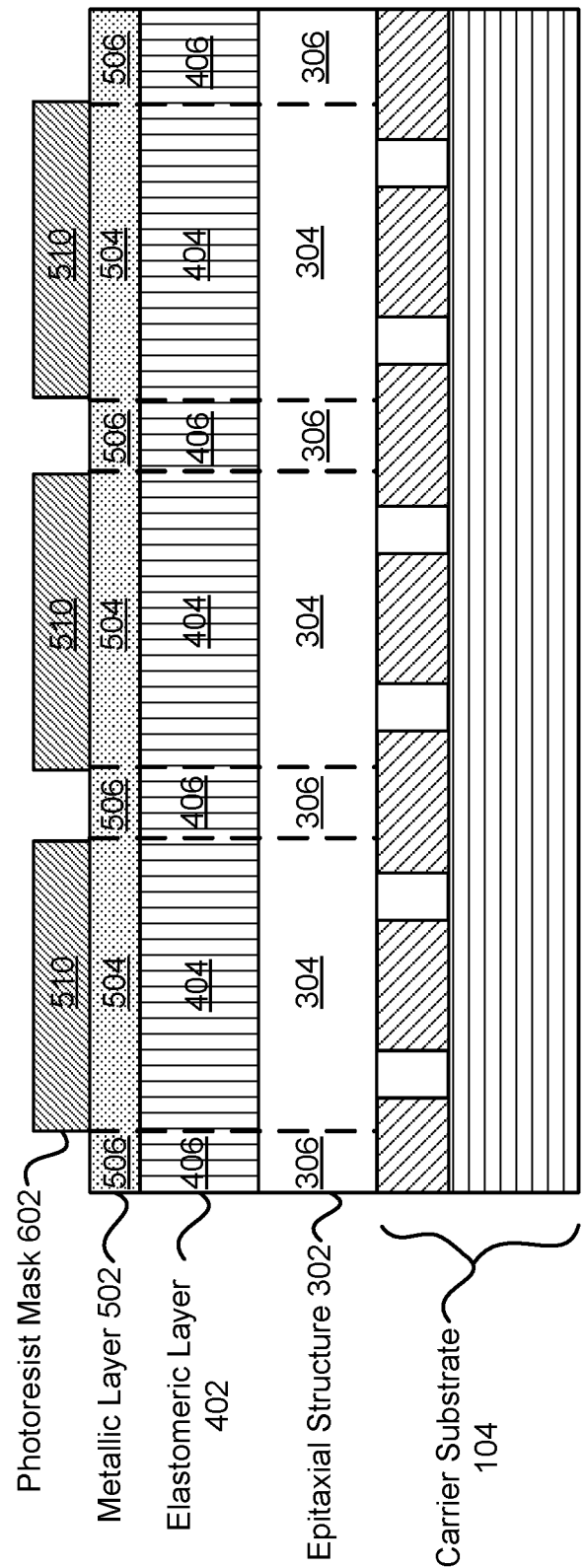
FIG. 6 is a cross sectional view of the LED dies including a photoresist mask on the metallic layer, according to one embodiment.

FIG. 6 is a cross sectional view of the LED dies 102 including a photoresist mask 602 on the metallic layer 502, according to one embodiment. The photoresist mask 602 is formed from the first portions 510 of the photoresist 508 by removing the second portions 512 of the photoresist 508, such that the photoresist mask 602 exposes the second portions 506 of the metallic layer 502 and covers the first portions 504 of the metallic layer 502. The depth of the photoresist 508 that forms the photoresist mask 602 is determined such that it prevents or resists the first portions 504 of the metallic layer 502 from being removed by an etching process (e.g., wet etching) while allowing the second portions 506 of the metallic layer 502 to be removed by the same etching process. The photoresist mask 602 is formed from the photoresist 508 formed on the metallic layer 502. For example, if the photoresist 508 is a positive photoresist, light is selectively applied to the second portions 512 of the photoresist 508 to render the second portions 512 soluble to a solvent. In another example, if the photoresist 508 is a negative photoresist, light is selectively applied to the first portions 510 of the photoresist to render the first portions 510 insoluble to a solvent. The light may be selectively applied using a photolithographic stepper or light mask.

After forming the photoresist mask 602 over the first portions 504 of the metallic layer 502, the second portions 506 of the metallic layer 502 are etched 208 using the photoresist mask 602 to form a metallic mask from the first portions of the metallic layer 502 over the first portions 404 of the elastomeric layer 402 and the first portions 304 of the epitaxial structure 302.

Figure 7:
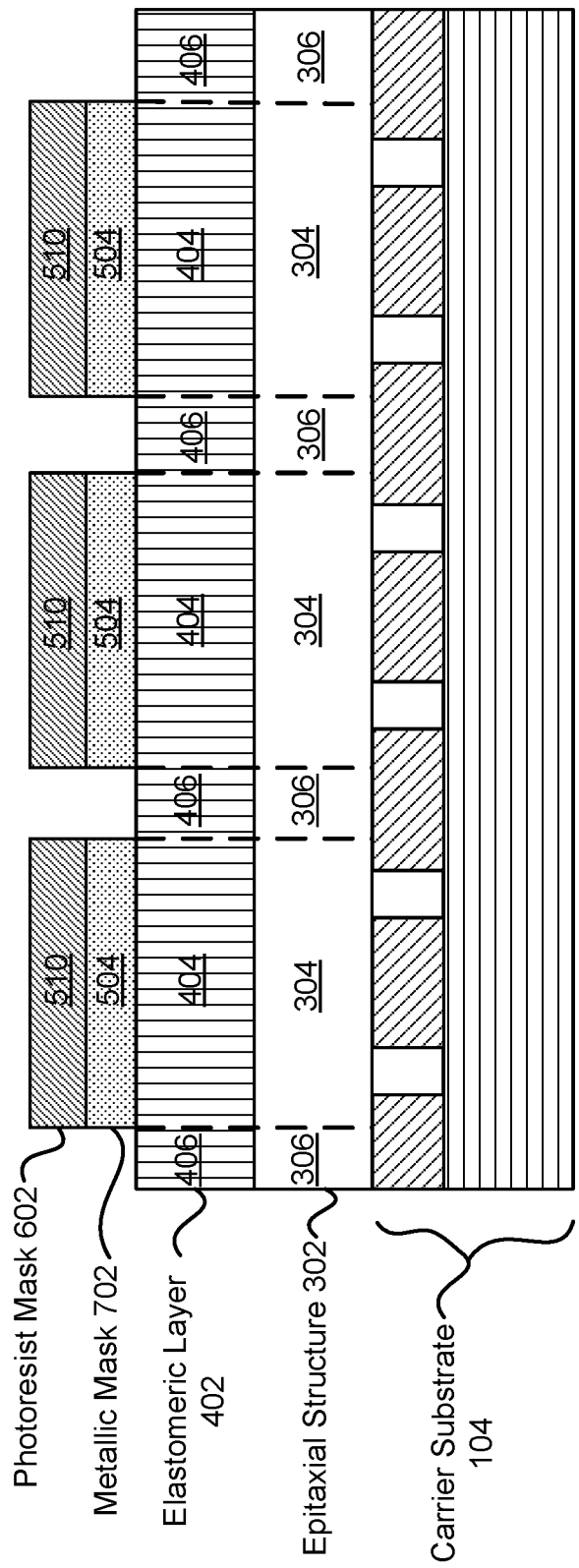
FIG. 7 is a cross sectional view of the LED dies including a metallic mask on the elastomeric layer, according to one embodiment.

FIG. 7 is a cross sectional view of the LED dies 102 including a patterned metallic mask 702 on the elastomeric layer 402, according to one embodiment. The etching process removes the second portions 506 of the metallic layer 502 to form the patterned metallic mask 702. In some embodiments the second portions 506 of the metallic layer 502 are removed by wet etching. Wet etching is a chemical process which removes material using liquid chemicals or etchants. For example, a solvent dissolves the exposed portions of the metallic layer 502 uncovered by the photoresist mask 602.

The wet etch may be an isotropic etching. In some embodiments, the wet etching is a timed etch to ensure that the first portions 504 of the metallic layer 502, defining the metallic mask 702, are preserved. In other embodiments, the first portions 406 of the elastomeric layer 402, or some other material layer, formed between the elastomeric layer 402 and the metallic mask 702, act as an etch stop layer during the wet etching of the metallic layer 502.

The metallic mask 702 created by the etching process exposes the second portions 406 of the elastomeric layer 402 and covers the first portions 404 of the elastomeric layer 402. In this way, the metallic mask 702 exposes the second portions 406 of the elastomeric layer 402 and the second portions 306 of the epitaxial structure 302 for a subsequent etching, while protecting the first portions 404 of the elastomeric layer 402 and the first portions of the epitaxial structure 302 during the subsequent etching.

After etching the second portions 506 of the metallic layer 502 to form the metallic mask 702 over the first portions 404 of the elastomeric layer 402, the second portions 406 of the elastomeric layer 402 and second portions 306 of the epitaxial structure 302 are etched 210 using the metallic mask 702. The metallic mask 702 shields the first portions 404 of the elastomeric layer 402 and the first portions 304 of the epitaxial structure 302 from the etching process. In some embodiments, the etching process is performed without the metallic mask 702 (i.e., using only the photoresist mask 602 to shield the first portions 404, 304). For example, the etching process is highly selective such that the second portions 406, 306 are removed before the etching process removes the photoresist mask 602.

Figure 8:
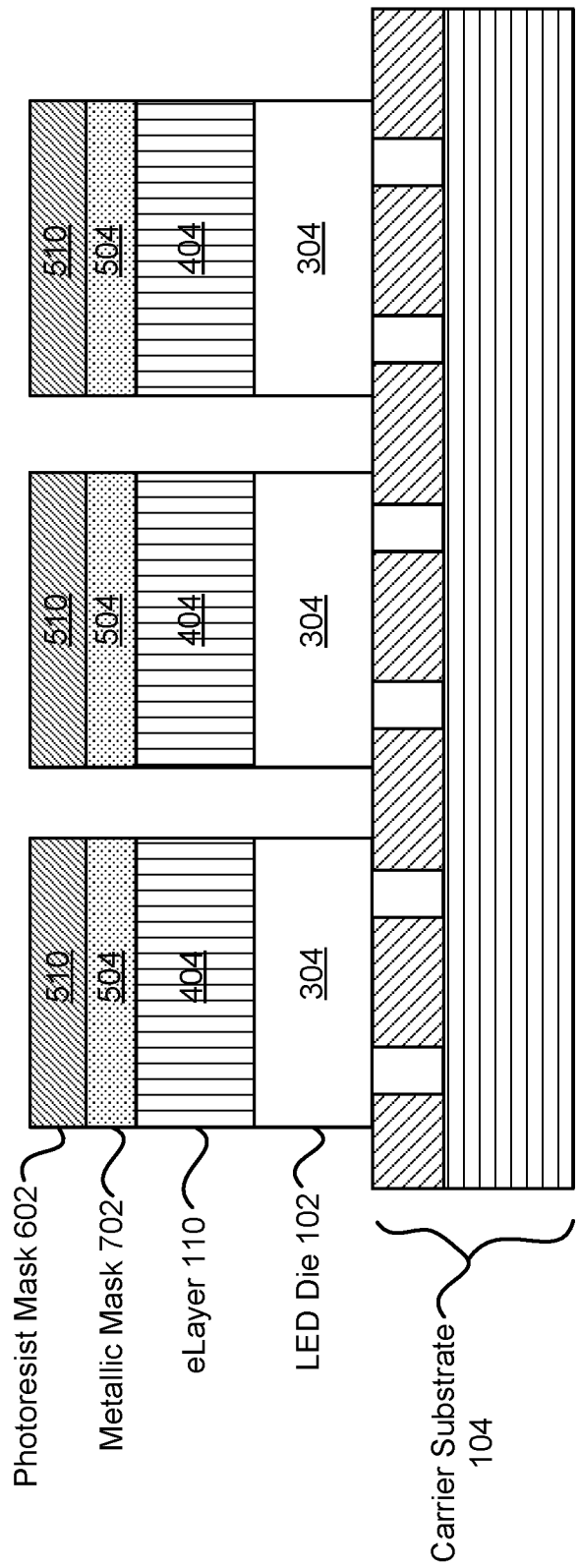
FIG. 8 is a cross sectional view of the LED dies with portions of the elastomeric layer and the epitaxial structure removed, according to one embodiment.

FIG. 8 is a cross sectional view of the LED dies 102 with the second portions 406 of the elastomeric layer 402 and the second portions 306 of the epitaxial structure 302 removed, according to one embodiment. The etching process creates an array of stacks, where each stack includes a first portion of the photoresist 508, metallic layer 502, elastomeric layer 402, and epitaxial structure 302. In some embodiments, the etching is done by dry etching. Dry etching is a process which removes material using plasmas or etchant gases. For example, the second portions 406, 306 are removed by inductively coupled plasma (ICP) etching. In these embodiments, the ICP recipe may be adjusted to increase the etching selectivity for the second portions 406, 306. For example, the ICP selectively etches an epitaxial structure 302 including GaN at a rate twice as high as the etching rate of the photoresist mask 602. In some embodiments, the dry etching process is an anisotropic process, such as deep reactive-ion etching (DRIE). The anisotropic etch provides for deep vertical etching into the epitaxial structure 302 to singulate the LED dies 102 with minimal horizontal etching into the LED dies 102 or into the first portions 404 of the elastomeric layer 402. In some embodiments, the dry etching is a timed etch to ensure that the first portions 404 of the elastomeric layer 402 and the first portions 304 of the epitaxial structure 302 are preserved. In other embodiments, the hard handle 108, or some other material layer, formed between the epitaxial structure 302 and the hard handle 108, act as an etch stop layer during the dry etching of the elastomeric layer 402 and epitaxial structure 302.

After etching the second portions 406 of the elastomeric layer 402 and the second portions 306 of the epitaxial structure 302, the photoresist mask 602 and metallic mask 702 are removed 212 to form singulated LED dies 102 from the first portions 304 of the epitaxial structure 302, where each of the singulated LED dies 102 includes an elayer 110 formed from the first portions 404 of the elastomeric layer 402. This may be seen with reference to FIG. 1 and FIG. 8. In some embodiments, the photoresist mask 602 is removed by a photoresist stripper. In some embodiments, the metallic mask 702 and the photoresist mask 602 are removed by a wet etch which minimally removes the elayer 110 and LED dies 102. In other embodiments, one etching process removes both the photoresist mask 602 and metallic mask 702.

Figure 9:
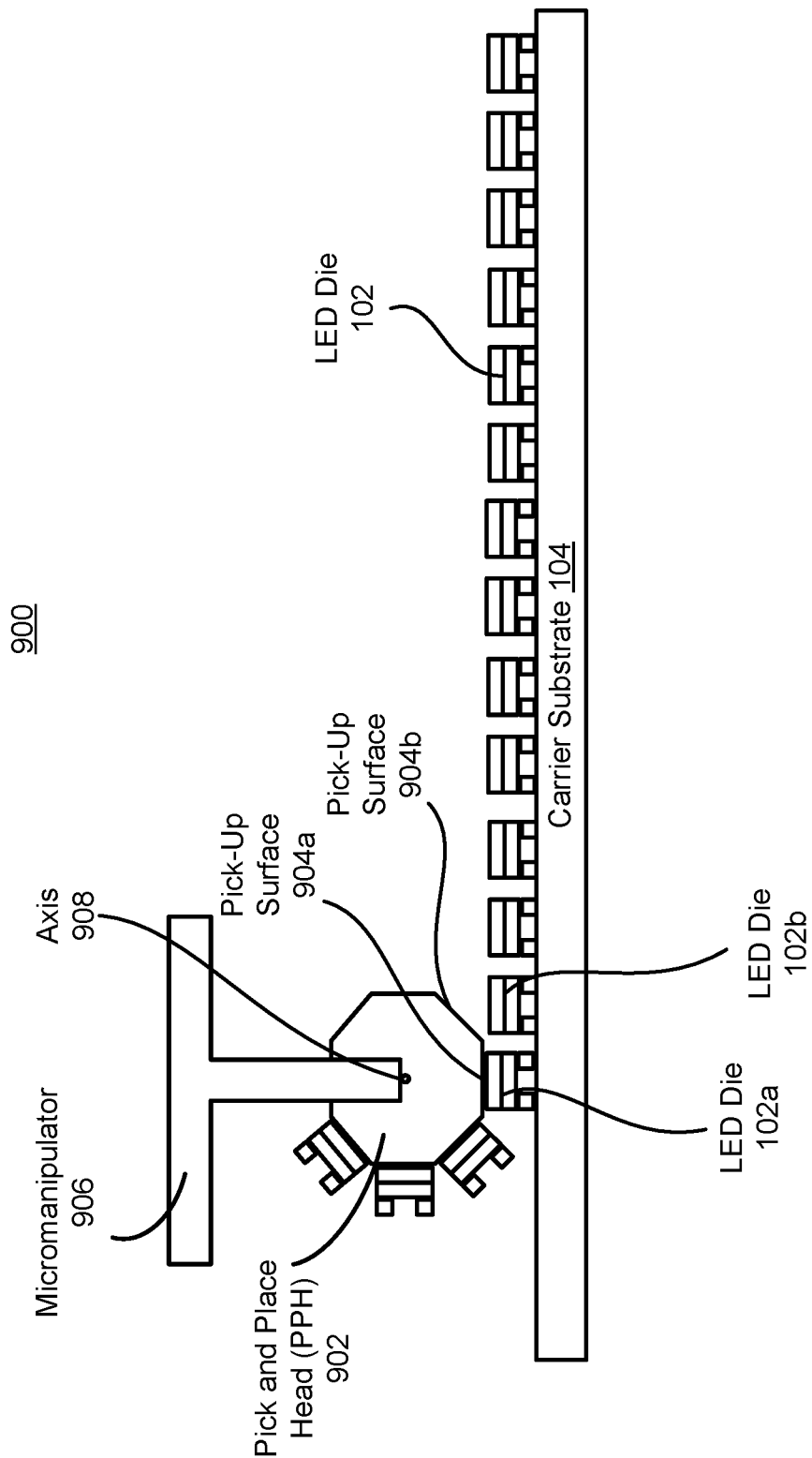
FIG. 9 is a display manufacturing system during pick up of LED dies from a carrier substrate, according to one embodiment.

FIG. 9 is a display manufacturing system 900 during pick up of the LED dies 102 from a carrier substrate 104, according to one embodiment. The system 900 includes a PPH 902 for picking LED dies 102 from the carrier substrate 104. The system 900 includes the LED dies 102, the carrier substrate 104, a micromanipulator 906, a PPH 902 defining an axis 908, and pick-up surfaces 904. The LED dies 102 are mounted to the carrier substrate 104. The micromanipulator 906 moves the PPH 902, such as with 6 degrees of freedom. The PPH 902 includes pick-up surfaces 904 that adheres with the elayers 110 of the LED dies 102 for pick and place operations.

The micromanipulator 906 is connected to the PPH 902 and controls movement of the PPH 902. The micromanipulator 906 aligns the PPH 902 with the carrier substrate 104 to allow the PPH 902 to pick up one or more LED dies 102. In some embodiments, the micromanipulator 906 may be a multiple degree of freedom micromanipulator, such as a four degree of freedom micromanipulator configured to move the PPH 902 up and down, left and right, forward and back, or rotate the PPH 902 (e.g., along the rotational axis 908). In some embodiments, the system 900 includes multiple micromanipulators 906 and/or PPHs 902 perform pick and place tasks in parallel to increase throughput of the system.

The PPH 902 has a polygon shaped cross section. The edges of the polygon shape cross section define multiple pick-up surfaces 904 of the PPH 902. The elayer 110 of each LED dies 102 are configured to mount to the pick-up surfaces 904 (e.g., due to adhesion forces) to facilitate transfer of the LED dies 102 from the carrier substrate 104 to a display substrate 1002. The PPH 902 may be rotated along the rotational axis 908 to pick up arrays of LED dies 102 at one or more pick-up surfaces 904. Although the PPH 902 has an octagonal cross section and eight pick-up surfaces 904, a PPH 902 may have different shaped cross sections (e.g., triangular, square, hexagon, etc.) and different numbers of pick-up surfaces in various embodiments. Although the pick and place tool discussed herein is a PPH 902, other types of pick-up heads using adhesive attachment with elayers 110 may be used.

The pick-up surfaces 904 may be non-conformable pick-up heads that allow the LED dies 102 with elayers 110 to attach to the PPH 902. For example, the pick-up surfaces 904 may be glass or fused silica. The pick-up surfaces 904 interface with the elayer 110 of the LED dies 102 using adhesion forces, such as Van der Waals forces. The hard handle 108 may be removed from the carrier substrate 104 before the pick-up surfaces 904 attach to the elayer 110 of each LED die 102. Although the elayers 110 discussed herein are particularly adapted for non-conformable pick-up heads, in some embodiments, the pick-up surfaces 904 are conformable, such as with an elastomeric coating.

Subsequent to the PPH 902 picking up the one or more first LED dies 102a with the first pick-up surface 904a, the PPH 902 is rotated about axis 908 to pick up one or more second LED dies 102b with a second pick-up surface 904b of the PPH 902. The second pick-up surface 904b may be adjacent to the first pick-up surface 904a, as shown in FIG. 9, or may be a non-adjacent pick-up surface 904 to the first pick-up surface 904a.

FIG. 10 is a cross sectional view of the display manufacturing system 900 during LED die 102 placement on a display substrate 1002, according to one embodiment. The LED dies 102 attached to the PPH 902 via the elayers 110 are placed on the display substrate 1002 of an electronic display.

After the PPH 902 has been populated with LED dies 102, the PPH 902 is moved away from the carrier substrate 104 and aligned with the display substrate 1002. For example, the PPH 902 may be lifted away from the carrier substrate 104 by the micromanipulator 906 for subsequent placement of the LED dies 102 on the display substrate 1002. The micromanipulator 906 places the LED dies 102 on the display substrate 1002 by aligning the PPH 902 with the display substrate 1002 and rolling the PPH 902 across the display substrate 1002. The display substrate 1002 may be part of an electronic display with the LED dies 102 placed at sub-pixel locations to connect with the control circuits in the display substrate 1002 that drive the LED dies 102. For example, the display substrate 1002 may be a printed circuit board including gate lines and data lines for a control circuit at each sub-pixel that drive the LED dies 102 according to signals on the gate and data lines. After placement, the LED dies 102 may be bonded to the display substrate 1002, such as using thermocompression (TC) bonding.

Figure 11:
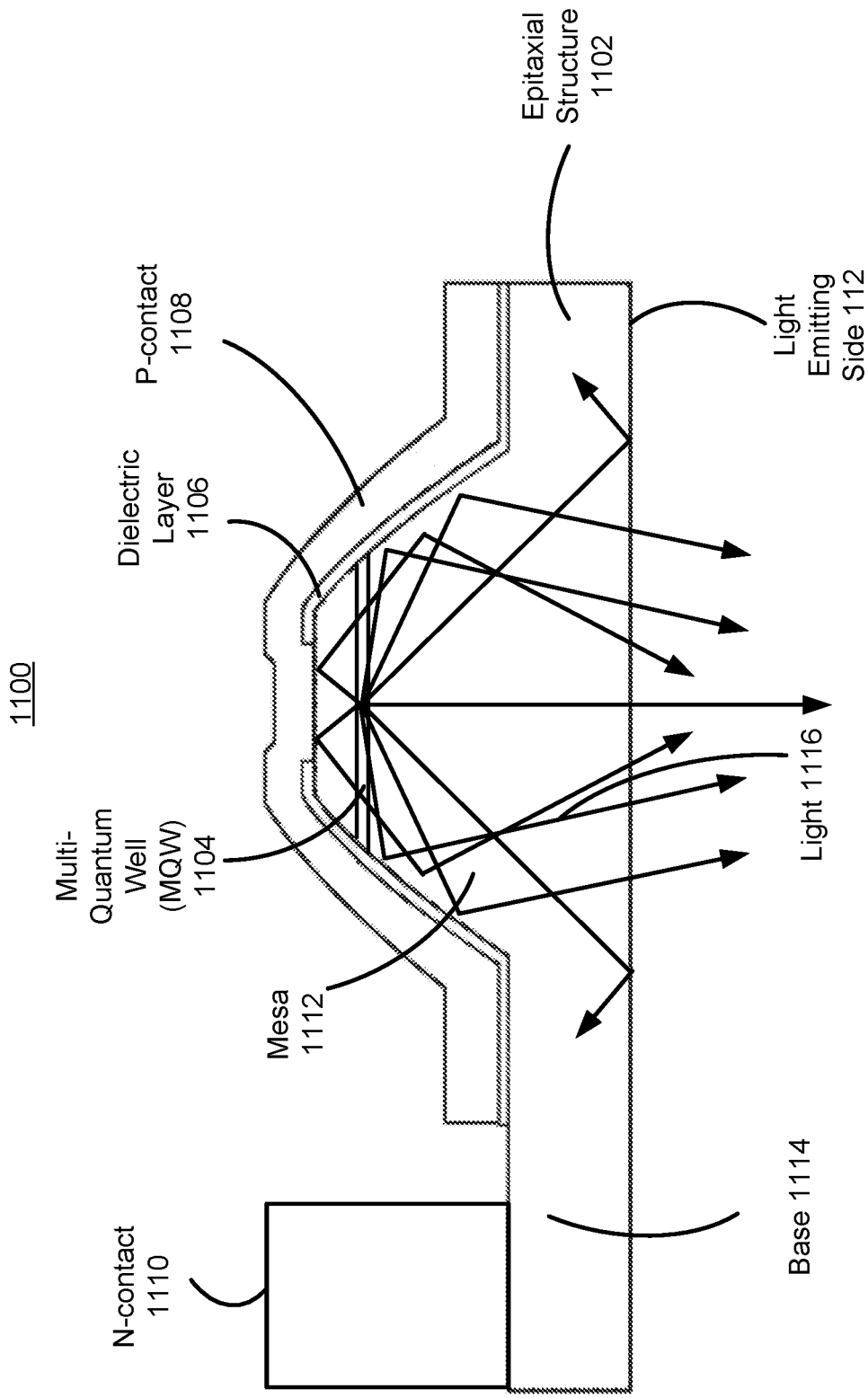
FIG. 11 is a schematic diagram of a cross section of a micro-LED, according to one embodiment.

FIG. 11 is a schematic diagram of a cross section of a uLED 1100, according to one embodiment. The uLED 1100 is an example of an LED die 102 having a light emitting side 112 on which the elayer 110 is formed to facilitate adhesive attachment with a pick-up head. The uLED 1100 may include, among other components, an epitaxial structure 1102 formed on a growth substrate (not shown). The epitaxial structure 1102 includes a multi-quantum well ("MQW") 1104. The uLED 1100 further includes a dielectric layer 1106 on the epitaxial structure 1102, a p-contact 1108 on the dielectric layer 1106, and an n-contact 1110 on the epitaxial structure 1102. The epitaxial structure 1102 is shaped, such as via an etch process, into a mesa 1112 and a base 1114 of the mesa 1112. The multi-quantum well 1104 defines an active light emitting area that is included in the structure of the mesa 1112. The mesa 1112 may include a truncated top defined on a side opposed to a light emitting side 112 of the uLED 1100.

If the semiconductor structure of the uLED 1100 is grown on a growth substrate, such as a non-transparent substrate, the growth substrate may be removed to reveal the light emitting side 112 as shown in FIG. 11. In another example, the growth substrate is not removed, such as when the growth substrate is transparent for the light emitted by the uLED 1100.

The mesa 1112 may include various shapes, such as a parabolic shape with a truncated top, to form a reflective enclosure for light 1116 generated within the uLED 1100. In other embodiments, the mesa 1112 may include a cylindrical shape with a truncated top, or a conic shape with a truncated top. The arrows show how the light 1116 emitted from the MQW 1104 is reflected off the p-contact 1108 and internal walls of the mesa 1112 toward the light emitting side 112 at an angle sufficient for the light to escape the uLED device 1100 (i.e., within a critical angle of total internal reflection). The p-contact 1108 and the n-contact 1110 connect the uLED 1100, such as to the display substrate including a control circuit for the uLED 1100. The n-contact 1110 is formed at the base 1114 on a side opposite the light emitting side 112.

The uLED 1100 may include an active light emitting area defined by the MQW 1104. The uLED 1100 directs the light 1116 from the MQW 1104 and increases the brightness level of the light output. In particular, the mesa 1112 and p-contact 1108 cause reflection of the light 1116 from the MQW 1104 to form a collimated or quasi-collimated light beam emerging from the light emitting side 112.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method, comprising:
   forming one or more layers on a first surface of an epitaxial structure, first portions of the epitaxial structure defining an array of light emitting diode (LED) dies, at least a subset of the first portions placed between second portions of the epitaxial structure, a second surface of the epitaxial structure facing a carrier substrate, wherein forming the one or more layers on the first surface of the epitaxial structure comprises:
      forming an elastomeric layer over the first surface of the epitaxial structure; and
      forming a metallic layer over the elastomeric layer; and
   singulating the one or more layers and the epitaxial structure into individual LED dies by selectively etching the second portions of the epitaxial structure and portions of the one or more layers over the second portions of the epitaxial structure.

2. The method of claim 1, wherein forming the one or more layers on the first surface of the epitaxial structure further comprises:
forming a photoresist mask over the metallic layer.

3. The method of claim 2, wherein singulating the one or more layers and the epitaxial structure further comprises:
etching portions of the metallic layer over the second portions of the epitaxial structure to form a patterned metallic mask; and
etching the second portions of the epitaxial structure and portions of the elastomeric layer over the second portions of the epitaxial structure.

4. The method of claim 3, further comprising:
removing the photoresist mask and the metallic mask to form singulated LED dies, each of the singulated LED dies including an elastomeric interface layer formed from portions of the elastomeric layer over the first portions of the epitaxial structure.

5. The method of claim 4, further comprising:
picking up at least a portion of the LED dies on the carrier substrate by attaching a non-conformable pick-up head to the elastomeric interface layers over the LED dies; and
placing the at least a portion of the LED dies attached to the non-conformable pick-up head on a display substrate defining pixel control circuits of an electronic display.

6. The method of claim 3, wherein etching the portions of the metallic layer is performed by wet etching.

7. The method of claim 3, wherein etching the portions of the elastomeric layer and the second portions of epitaxial structure is performed by anisotropic dry etching.

8. The method of claim 7, wherein the anisotropic dry etching includes inductively coupled plasma (ICP) etching.

9. The method of claim 1, wherein the metallic layer is formed by electron-beam deposition.

10. The method of claim 1, wherein the LED dies are micro-LEDs or vertical-cavity surface-emitting lasers (VCSELs).

11. A light emitting diode (LED) die manufactured by a process, comprising:
forming one or more layers on a first surface of an epitaxial structure, a first portion of the epitaxial structure defining a light emitting diode (LED) die, at least a portion of the first portion placed between second portions of the epitaxial structure, a second surface of the epitaxial structure facing a carrier substrate, wherein forming the one or more layers on the first surface of the epitaxial structure comprises:
forming an elastomeric layer over the first surface of the epitaxial structure; and
forming a metallic layer over the elastomeric layer; and
singulating the one or more layers and the epitaxial structure into an individual LED die by selectively etching the second portions of the epitaxial structure and portions of the one or more layers over the second portions of the epitaxial structure.

12. The LED die of claim 11, wherein forming the one or more layers on the first surface of the epitaxial structure further comprises:
forming a photoresist mask over the metallic layer.

13. The LED die of claim 12, wherein singulating the one or more layers and the epitaxial structure further comprises:
etching portions of the metallic layer over the second portions of the epitaxial structure to form a patterned metallic mask; and
etching the second portions of the epitaxial structure and portions of the elastomeric layer over the second portions of the epitaxial structure.

14. The LED die of claim 13, further comprising:
removing the photoresist mask and the metallic mask to form a singulated LED die, the singulated LED die including an elastomeric interface layer formed from a portion of the elastomeric layer over the first portion of the epitaxial structure.

15. The LED die of claim 14, wherein the process further includes:
picking up the LED die on the carrier substrate by attaching a non-conformable pick-up head to the elastomeric interface layer over the LED die; and
placing the LED die attached to the non-conformable pick-up head on a display substrate defining a pixel control circuit of an electronic display.

16. The LED die of claim 13, wherein the etching of the portions of the metallic layer is performed by wet etching.

17. The LED die of claim 13, wherein the etching of the portions of the elastomeric layer and the second portions of epitaxial structure is performed by anisotropic dry etching.

18. The LED die of claim 17, wherein the anisotropic dry etching includes inductively coupled plasma (ICP) etching.

19. The LED die of claim 11, wherein the metallic layer is formed by electron-beam deposition.

20. The LED die of claim 11, wherein the LED die is one of a micro-LED or a vertical-cavity surface-emitting laser (VCSEL).

* * * * *